United States Patent
Park et al.

(10) Patent No.: US 7,183,192 B2
(45) Date of Patent: Feb. 27, 2007

(54) COMPOSITION FOR REMOVING PHOTORESIST AND METHOD OF FORMING A BUMP ELECTRODE IN A SEMICONDUCTOR DEVICE USING THE COMPOSITION

(75) Inventors: Dong-Jin Park, Osan-si (KR); Sang-Mun Chon, Yongin-si (KR); In-Hoi Doh, Yongin-si (KR); Pil-Kwon Jun, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/858,472

(22) Filed: Jun. 2, 2004

(65) Prior Publication Data

US 2005/0032658 A1  Feb. 10, 2005

(30) Foreign Application Priority Data

Jun. 2, 2003 (KR) .................... 10-2003-0035404

(51) Int. Cl.
*H01L 21/44* (2006.01)
(52) U.S. Cl. ............... 438/614; 438/613; 257/E21.255; 257/E21.508
(58) Field of Classification Search ................ 438/745, 438/612, 613, 614
See application file for complete search history.

(56) References Cited

U.S. PATENT DOCUMENTS

| | | | | | |
|---|---|---|---|---|---|
| 4,617,251 A | * | 10/1986 | Sizensky | .................... | 430/256 |
| 4,770,713 A | | 9/1988 | Ward | | |
| 5,171,711 A | * | 12/1992 | Tobimatsu | .................. | 438/614 |
| 5,798,323 A | | 8/1998 | Honda et al. | | |
| 2005/0101500 A1 | * | 5/2005 | Baik et al. | .................. | 510/175 |

FOREIGN PATENT DOCUMENTS

| | | |
|---|---|---|
| JP | 9-283508 | 10/1997 |
| KR | 1020010067436 A | 7/2001 |
| KR | 2001-80865 | 8/2001 |
| KR | 10-0360985 | 10/2002 |

* cited by examiner

*Primary Examiner*—Alexander Ghyka
(74) *Attorney, Agent, or Firm*—Volentine & Whitt, PLLC

(57) ABSTRACT

A passivation layer pattern having an opening is formed on a substrate having a metal wiring pattern formed thereon. The opening partially exposes an upper surface of the metal wiring pattern. A photoresist pattern is formed on the passivation layer pattern. The photoresist pattern has an opening that exposes the opening of the passivation layer pattern, and metal is electroplated in the openings to form a bump electrode. The photoresist pattern is removed using a composition including monoethanolamine and dimethylacetamide.

14 Claims, 4 Drawing Sheets

COMPOSITION FOR REMOVING PHOTORESIST AND METHOD OF FORMING A BUMP ELECTRODE IN A SEMICONDUCTOR DEVICE USING THE COMPOSITION

CROSS REFERENCE TO RELATED APPLICATION

This application claims priority under 35 USC § 119 to Korean Patent Application No. 2003-35404, filed on Jun. 2, 2003, the contents of which are incorporated herein by reference in their entirety.

BACKGROUND OF THE INVENTION

1. Field of the Invention

The present invention relates to a composition for removing photoresist and to a method of forming a bump electrode in a semiconductor device using the composition. More particularly, the present invention relates to a composition characterized by a simplified formulation and the effective removal of photoresist, and to a method of forming a bump electrode in a semiconductor device using the composition.

2. Description of the Related Art

To facilitate mounting of a packaged semiconductor chip having multiple pins on a printed circuit board of an electric or electronic device, the packaged semiconductor chip is preferably constructed to have a relatively low height. The packaged semiconductor chip generally includes a connection device such as a bump electrode which extrudes from the packaged chip by more than about 20 μm. As a highly integrated semiconductor chip is generally required, the bump electrode should have precise dimensions and structural characteristics.

The bump electrode may be formed in the semiconductor device by a process such as an electroplating process, a vacuum evaporation process or a stirred process using a wire bonding. The electroplating process is relatively simple and economical, and thus is widely used.

In the electroplating process, a passivation layer pattern is formed on a substrate having a metal wiring formed thereon to expose a bump electrode contact region of the metal wiring. A seed layer or a metal base layer is formed in the bump electrode contact region to electroplate metal for the bump electrode. A photoresist pattern is formed on the substrate including the bump electrode contact region where the bump electrode is formed. The bump electrode contact region is filled with the metal for the bump electrode. The photoresist pattern is then removed to complete the bump electrode. Here, the photoresist pattern is preferably thicker than a height of the bump electrode. Thick photoresist, which results in a photoresist layer having a thickness greater than about 5 μm, may be used to form the photoresist pattern. The thick photoresist should have a high adhesive strength relative to the substrate, a high plating solution resistance and a high wettability against the plating solution. Additionally, photoresist that can be easily detached from the substrate is preferable.

Since the photoresist pattern is relatively thick, the bottom portion of the photoresist pattern may not be exposed in an exposure process. When the photoresist pattern is removed by a subsequent ashing process, the photoresist pattern may be damaged by plasma used in the ashing process. In a subsequent stripping process, some of the photoresist pattern may reside between bump electrodes, thereby resulting in a failure of the semiconductor device.

In the stripping process, a composition used as a stripper dissolves the photoresist pattern, and then detaches the photoresist pattern from the substrate to remove the photoresist pattern. When the stripper fails either in dissolving or detaching of the photoresist pattern, the photoresist pattern may remain on the substrate. This also occurs when the stripper may not be mixed with water. Most organic stripper compositions are suitable for removing a polymer. When the stripper is used for removing the photoresist for forming the bump electrode, the photoresist may not be completely stripped or be recoated on the substrate. Hence, two kinds of stripper have been used, and a stripping process has been performed twice using each stripper. This increases the processing time.

A thinner composition may also be used for removing the photoresist. The thinner composition may process a semiconductor substrate by one sheet. When the thinner composition is used for processing a plurality of substrates at the same time, remainder of the photoresist pattern may reside on the substrate, thereby diminishing process efficiency.

Use of monoethanolamine as a solution for stripping photoresist is disclosed in U.S. Pat. No. 5,798,323 (issued to Honda et al.). Honda et al. discloses a composition including monoethanolamine to strip photoresist. Although the composition is proper for stripping a thin photoresist film having a thickness of about several microns, the composition may not be suitable for stripping a thick photoresist film.

Japanese Patent Laid Open Publication No. 1997-283,508 discloses a solution including monoethanolamine and dimethylacetamide for stripping polyimide. This Japanese Patent Publication also discloses a method of stripping an undesired polyimide layer using monoethanolamine and dimethylacetamide. The composition for stripping photoresist employed for forming a bump electrode, however, is not mentioned in the Japanese Patent Publication.

SUMMARY OF THE INVENTION

In accordance with one aspect of the present invention, there is provided a composition for removing photoresist that includes about 13 to about 37% by weight of monoethanolamine and about 63 to about 87% by weight of dimethylacetamide.

In accordance with another aspect of the present invention, there is provided a method of forming a bump electrode in a semiconductor device. In the method, a passivation layer pattern having an opening is formed on a substrate having a metal wiring pattern formed thereon. The opening partially exposes an upper surface of the metal wiring pattern. A photoresist pattern is formed on the passivation layer pattern. The photoresist pattern has an opening that exposes the opening of the passivation layer pattern, and metal is electroplated in the openings to form a bump electrode. The photoresist pattern is removed using a composition including monoethanolamine and dimethylacetamide.

BRIEF DESCRIPTION OF THE DRAWINGS

The above and other features and advantages of the present invention will become readily apparent by reference to the following detailed description when considered in conjunction with the accompanying drawings, in which.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, the embodiments are provided so that this disclosure will be thorough and complete, and will fully convey the scope of the invention to those skilled in the art. The relative thickness of layers in the illustrations may be exaggerated for descriptive purposes.

Hereinafter, a composition for removing photoresist according to the present invention will be described in detail.

The composition for removing photoresist consists of monoethanolamine and dimethylacetamide as the primary active components.

Photoresist removal efficiency is reduced if the amount of monoethanolamine is less than about 13% by weight or greater than about 37% by weight based on a total weight of the composition. Thus, the composition includes about 13 to about 37% by weight, preferably about 18 to about 32% by weight, more preferably about 20 to about 30% by weight of monoethanolamine.

Likewise, photoresist removal efficiency is reduced if the amount of dimethylacetamide is less than about 63% by weight or more than about 87% by weight based on the total weight of the composition. Thus, the composition includes about 63 to about 87% by weight, preferably about 68 to about 82% by weight, more preferably about 70 to about 80% by weight of dimethylacetamide.

Preferably, the composition consists essentially of monoethanolamine and dimethylacetamide, meaning that all or substantially all of the composition is composed of monoethanolamine and dimethylacetamide.

Hereinafter, a method of forming a bump electrode according to an embodiment of the present invention will be described in detail.

FIGS. 1A to 1G are cross-sectional views illustrating the method of forming a bump electrode according to one embodiment of the present invention.

Figure 1A:
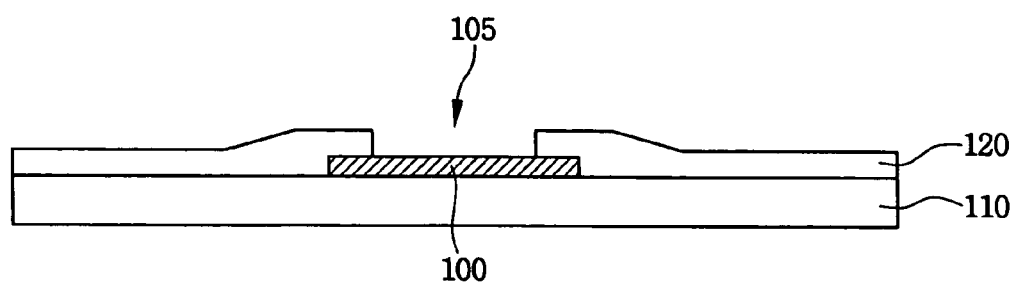
FIGS. 1A to 1G are cross-sectional views illustrating a method of forming a bump electrode according to one embodiment of the present invention.

Referring to FIG. 1A, polyimide is coated on a substrate 110 having a metal wiring pattern 100, for example an aluminum (Al) wiring pattern, formed thereon to form a polyimide layer serving as a passivation layer. The passivation layer is patterned to partially remove the polyimide layer on the metal wiring pattern 100. As a result, a passivation layer pattern 120 having an opening 105 is formed on the substrate 110. The opening 105 of the passivation layer pattern 120 partially exposes the metal wiring pattern 100.

Figure 1B:
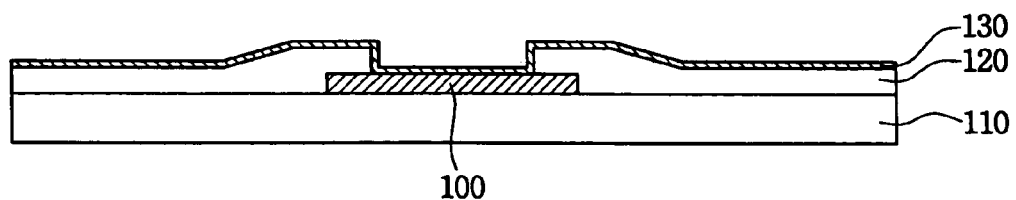

Referring to FIG. 1B, a seed layer 130 for an electroplating process is uniformly formed on the passivation layer pattern 120 having the opening 105. The seed layer 130 is continuously coated on the sidewall of the opening 105, on the metal wiring pattern 100 exposed by the opening 105, and on the passivation layer pattern 120 in accordance with a profile of the opening 105.

The seed layer 130 may include metal such as titanium (Ti), nickel (Ni) or palladium (Pd). The seed layer 130 may be formed to have a single-layered structure. Alternatively, the seed layer 130 may be formed to have a multi-layered structure. For example, titanium may be deposited on the substrate 110 by a sputtering process to have a thickness of about 1000 Å to form the seed layer 130. Alternatively, nickel may be deposited on the substrate 110 to have a thickness of about 1500 Å to form the seed layer 130. In addition, palladium may also be deposited on the substrate 110 to have a thickness of about 500 Å to form the seed layer 130.

Figure 1C:
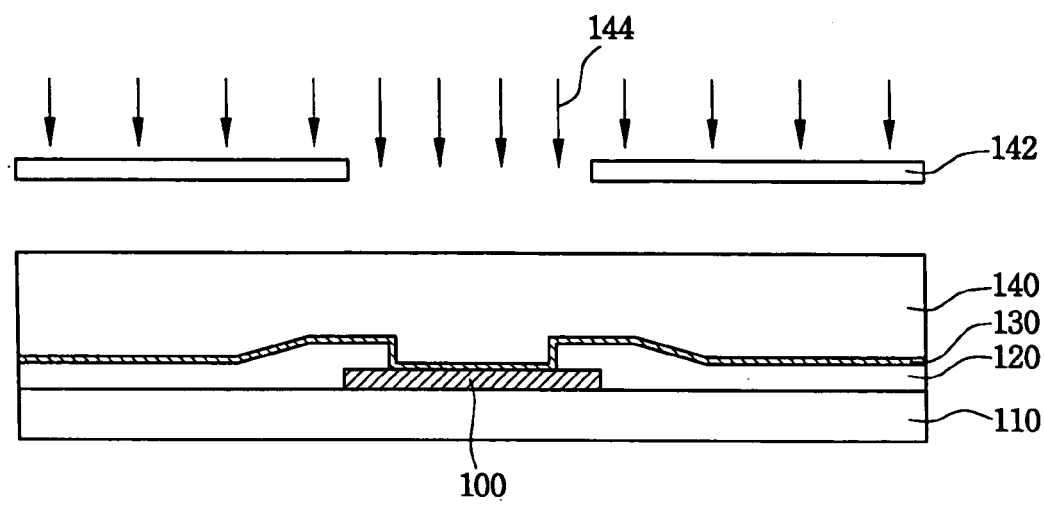

Referring to FIG. 1C, photoresist is coated on the seed layer 130 to form a photoresist film 140. For example, the photoresist film 140 may be formed by a spin coating process. The photoresist film 140 preferably has a thickness of about 20 to about 30 μm. The photoresist film 140 may be formed using photoresist for an i-line wavelength (or an i-line photoresist).

The photoresist film 140 is exposed to ani-line light 144 using a photomask 142.

Figure 1D:
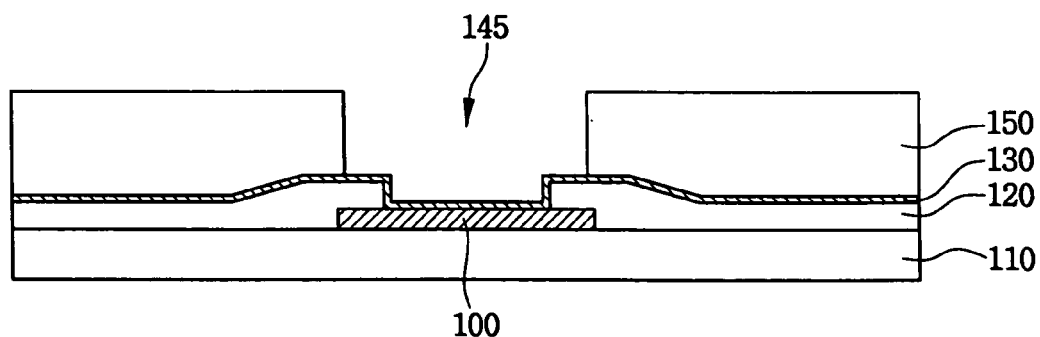

Referring to FIG. 1D, the exposed photoresist film 140 is developed to remove an exposed portion of the photoresist film 140. As a result, a photoresist pattern 150 having a bump electrode opening 145 is formed on the seed layer 130. Here, the bump electrode opening 145 exposes a region of the passivation pattern 120 positioned on the metal wiring pattern 100. A bump electrode 160 will be formed in the region of the passivation pattern 120. The region of the passivation pattern 120 includes the opening 105 and portions of the passivation layer pattern 120 positioned on the metal wiring pattern 100 adjacent to the opening 105. The bump electrode opening 145 hasis larger than the opening 105 of the passivation layer pattern 120. The bump electrode opening 145 exposes a bottom face and a sidewall of the opening 105 of the passivation layer pattern 120, and portions of the seed layer 130 adjacent to the opening 105 of the passivation layer pattern 120.

Figure 1E:
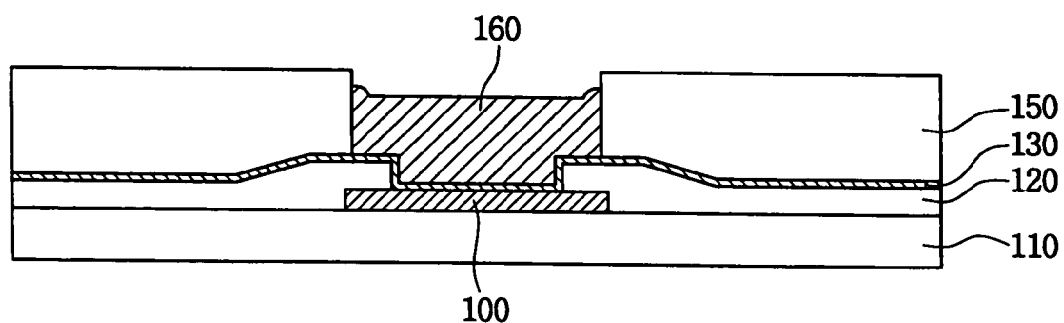

Referring to FIG. 1E, metal such as gold (Au) is electroplated in the bump electrode opening 145 to form the bump electrode 160. The bump electrode 160 preferably has a thickness which is less than or equal to the height of the bump electrode opening 145 of the photoresist pattern 150. For example, the bump electrode 160 may have a thickness of about 11 to about 20 μm.

Figure 1F:
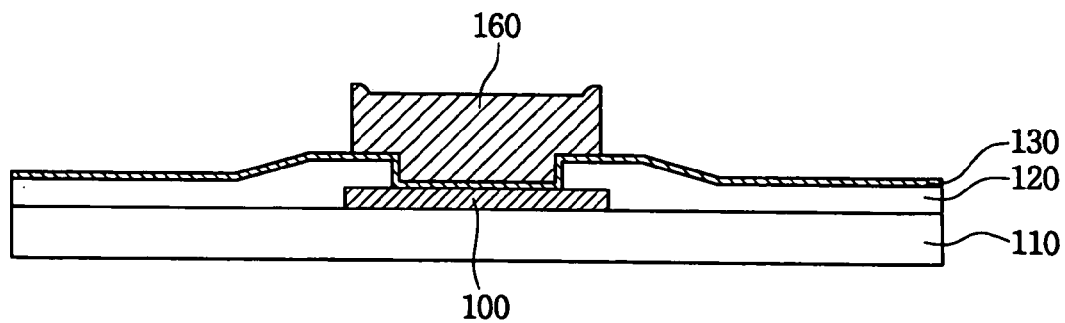

Referring to FIG. 1F, the photoresist pattern 150 is removed by stripping using the previously described composition for removing photoresist. The stripping process is preferably performed at a temperature of about 45 to about 70° C. for about 20 to about 40 minutes.

As mentioned above, the composition for removing photoresist includes about 15 to about 35% by weight of monoethanolamine and 65 to about 85% by weight of dimethylacetamide. Since preferably the composition for removing photoresist essentially includes two components of, namely monoethanolamine and dimethylacetamide, the formulation of the composition for removing photoresist may be simplified.

Figure 1G:
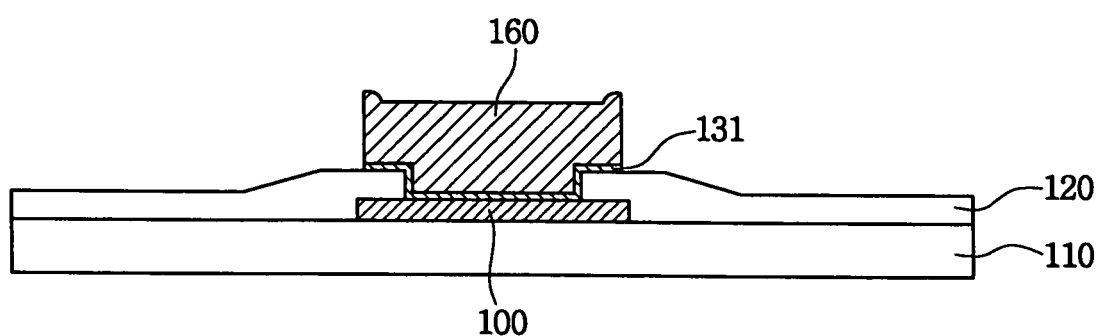

Referring to FIG. 1G, the seed layer 130 is exposed as a result of removal of the photoresist pattern 150. Hence, a seed layer pattern 131 is formed beneath the bump electrode 160. That is, the seed layer 130 positioned beneath the photoresist pattern 150 prior to removing the photoresist pattern 150 is removedfor, whereas the portion of the seed layer 130 (namely, the seed layer pattern 131) beneath the bump electrode 160 remains.

After the photoresist pattern 150 is removed, the substrate 110 is rinsed using deionized water and then dried.

In the process for forming the bump electrode, the photoresist pattern may be easily removed using the composition for removing photoresist according to embodiments of the present invention. Thus, the photoresist pattern may be easily removed without an additional process such as an ashing process.

Hereinafter, the present invention will be fully described with reference to examples. The examples are given solely for the purpose of illustration and are not to be construed as limitations of the present invention, as many variations thereof are possible without departing from the spirit and scope of the invention.

Preparation of a Composition for Removing Photoresist Pattern

EXAMPLES 1 to 5 AND COMPARATIVE EXAMPLES 1 to 6

Monoethanolamine and dimethylacetamide were incorporated into containers in ratios shown in a following Table 1 and then mixed. Compositions of Examples 1 to 5 and Comparative Examples 1 to 6 were obtained.

Evaluation of Photoresist Pattern Removal Efficiency 1

Photoresist pattern removal efficiencies were evaluated using the compositions of Examples 1 to 5 and Comparative Examples 1 to 6, respectively.

According to the above-described method with reference to FIGS. 1A to 1E, gold was electroplated in the bump electrode opening. il-line wavelength (365 nm) photoresist was coated on the substrate to have a thickness of about 20 μm. The gap between the bump electrode and an adjacent bump electrode was at least about 10 μm. As shown in FIG. 1F, the photoresist pattern was removed using the composition of Example 1. A stripping process was performed at the temperature of about 60° C. for about 30 minutes. The amount of removed photoresist pattern was represented by percentage. The test was repeated for the compositions of Examples 2 to 5 and Comparative Examples 1 to 6, respectively. The removal efficiencies of each composition are shown in the Table 1.

TABLE 1

| | Monoethanolamine (wt %) | Dimethylacetamide (wt %) | Removal efficiency (%) |
|---|---|---|---|
| Example 1 | 15 | 85 | 90 |
| Example 2 | 20 | 80 | 100 |
| Example 3 | 25 | 75 | 100 |
| Example 4 | 30 | 70 | 100 |
| Example 5 | 35 | 65 | 90 |
| Comparative Example 1 | 0 | 100 | 50 |
| Comparative Example 2 | 5 | 95 | 70 |
| Comparative Example 3 | 10 | 90 | 80 |
| Comparative Example 4 | 40 | 60 | 70 |
| Comparative Example 5 | 45 | 55 | 60 |
| Comparative Example 6 | 50 | 50 | 40 |

For evaluating the removal efficiency, when the photoresist pattern is totally removed from the substrate, the removal efficiency was defined as 100%. When none of the photoresist pattern was removed from the substrate, the removal efficiency was also defined as 0%. The removal efficiency was divided into 10 grades representing each of the grades 10% reduction of the removal efficiency.

As shown in Table 1, each of the compositions of Examples 1 to 5 has a removal efficiency of at least about 90%. The compositions of Examples 2 to 4, which include about 20 to about 30% by weight of monoethanolamine and about 80 to about 70% by weight of dimethylacetamide, result in a removal efficiency of substantially 100%, completely removing the photoresist pattern.

Evaluation of Photoresist Pattern Removal Efficiency 2

The evaluation procedure of photoresist pattern removal efficiency 1 using the composition of Example 2 was repeated while changing the temperature and application time of the composition. As before, the amount of removed photoresist pattern was represented by percentage. The removal efficiency is shown in a Table 2.

TABLE 2

| Composition | Temperature (° C.) | Time (minutes) | Removal efficiency (%) |
|---|---|---|---|
| Example 2 | 50 | 30 | 90 |
| | 60 | | 100 |
| | 70 | | 100 |
| | 60 | 20 | 90 |
| | | 30 | 100 |
| | | 40 | 100 |

As shown in Table 2, when the stripping process was performed at a temperature of at least about 50° C. for at least about 20 minutes, the compositions showed a removal efficiency of at least about 90%. When the stripping process was performed at a temperature of higher than about 50° C. for at least about 30 minutes, the compositions showed a removal efficiency of substantially 100%, completely removing the photoresist pattern from the substrate.

The compositions used in the evaluation of the photoresist pattern removal efficiency 1 comprises about 13 to about 37% by weight of monoethanolamine and about 63 to about 87% by weight of dimethylacetamide.

Use of the compositions in the stripping process at a temperature of at least about 45° C. for about 30 minutes results in a removal efficiency of at least about 90%, which is preferable for a stripping process. In particular, the composition comprising about 25% by weight of monoethanolamine and about 75% by weight of dimethylacetamide is preferable. Use of the composition in the stripping process at a temperature of greater than about 50° C. for at least about 30 minutes gives a removal efficiency of substantially 100%.

The removal efficiency depends on the formulation of the composition for removing the photoresist. The removal efficiency is also related to the temperature of the stripping process and the application time of the composition. As shown in Table 2, the compositions showed the removal efficiency of about 90% when the stripping process was performed at a temperature of about 50° C. for about 30 minutes. On the other hand, the compositions showed the removal efficiency of about 100% when the stripping process was performed at the temperature of at least about 60° C. for about 30 minutes. When the stripping process was performed at a temperature of about 60° C. for about 20 minutes, the composition showed the removal efficiency of substantially 90%. When the stripping process was performed at a temperature of about 60° C. for at least about 30 minutes, the composition showed the removal efficiency of substantially 100%. When the stripping process was performed at a temperature of at least a temperature of about 60° C. for at least about 30 minutes, the removal efficiency gives the best results.

Modification of the formulation of the composition by itself may not sufficiently increase the removal efficiency. Control of the temperature of the stripping process and the application time of the composition may effectively remove the photoresist pattern.

As described above, a composition including monoethanolamine and dimethylacetamide is used to efficiently remove a photoresist pattern for forming a bump electrode. When removing the photoresist pattern, the composition according to the present invention is used without any additional process such as an ashing process. Use of the composition efficiently and completely removes the photoresist pattern via a stripping process.

The composition according to the present invention is stable and has a relatively simple formulation. The composition may remove a large amount of photoresist pattern at a relatively low temperature. Further, residue may not be formed in the processing bath, and the operation efficiency may be improved.

What is claimed is:

1. A method of forming a bump electrode in a semiconductor device, the method comprising:
   forming a passivation layer pattern having a first opening over a substrate including a metal wiring pattern formed thereon, wherein the passivation layer pattern comprises polyimide and the first opening partially exposes an upper surface of the metal wiring pattern;
   forming a photoresist pattern on the passivation layer pattern, the photoresist pattern having a second opening that exposes the first opening of the passivation layer pattern, wherein the first and second openings define a bump electrode opening;
   electroplating a metal in the bump electrode opening to define a bump electrode; and
   removing the photoresist pattern using a composition consisting essentially of about 13 to less than 30% by weight of monoethanolamine and more than 70 to about 87% by weight of dimethylacetamide based on a total weight of the composition.

2. The method of claim 1, wherein the metal wiring pattern comprises aluminum.

3. The method of claim 1, wherein removing the photoresist pattern using the composition is performed at a temperature of at least about 45° C. for at least about 20 minutes.

4. The method of claim 1, wherein the photoresist pattern has a thickness of at least about 20 µm.

5. The method of claim 1, further comprising, prior to forming the photoresist pattern, forming a seed layer on an upper surface of the passivation layer pattern, on a sidewall of the first opening in the passivation layer pattern, and on the exposed upper surface of the metal wiring pattern.

6. The method of claim 5, wherein the metal comprises gold, and wherein the gold is electroplated on a surface portion of the seed layer exposed by the second opening of the photoresist pattern.

7. The method of claim 6, wherein a height of the bump electrode is less than a thickness of the photoresist pattern.

8. The method of claim 1, wherein the second opening is larger than the first opening and exposes an upper surface portion of the passivation layer pattern adjacent to the first opening.

9. A method of forming a bump electrode in a semiconductor device, the method comprising:
   forming a passivation layer pattern having a first opening over a substrate including an aluminum wiring pattern formed thereon, wherein the passivation layer pattern comprises polyimide and the first opening partially exposes an upper surface of the aluminum wiring pattern;
   forming a seed layer on an upper surface of the passivation layer pattern, on a sidewall of the first opening in the passivation layer pattern, and on the exposed upper surface of the aluminum wiring pattern;
   forming a photoresist pattern on the seed layer, the photoresist pattern having a second opening that exposes the first opening of the passivation layer pattern, wherein the first and second openings define a bump electrode opening;
   electroplating gold in the bump electrode opening to form a bump electrode; and
   removing the photoresist pattern using a composition consisting essentially of about 13 to less than 30% by weight of monoethanolamine and more than 70 to about 87% by weight of dimethylacetamide based on a total weight of the composition.

10. The method of claim 9, wherein removing the photoresist pattern is preformed at a temperature of at least about 50° C. for at least about 30 minutes.

11. The method of claim 9, wherein the photoresist pattern is formed to have a thickness of at least about 20 µm.

12. The method of claim 11, wherein a height of bump electrode is less than a thickness of the photoresist pattern.

13. The method of claim 9, wherein the second opening is larger than the first opening and exposes an upper surface portion the seed layer located on an upper surface portion of the passivation layer pattern adjacent to the first opening.

14. The method of claim 9, further comprising removing portions of the seed layer located beneath the photoresist pattern after removing the photoresist pattern.

* * * * *